US006590273B2

United States Patent
Okawa et al.

(10) Patent No.: US 6,590,273 B2
(45) Date of Patent: Jul. 8, 2003

(54) SEMICONDUCTOR INTEGRATED CIRCUIT DEVICE AND MANUFACTURING METHOD THEREOF

(75) Inventors: Shigeaki Okawa, Tochigi (JP); Toshiyuki Ohkoda, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/029,895

(22) Filed: Dec. 21, 2001

(65) Prior Publication Data

US 2002/0079554 A1 Jun. 27, 2002

(30) Foreign Application Priority Data

Dec. 25, 2000 (JP) ......................................... 2000-392221

(51) Int. Cl.[7] .............................................. H01L 29/00
(52) U.S. Cl. ....................... 257/544; 257/505; 257/606; 257/653; 438/203; 438/205; 438/313
(58) Field of Search ................................ 257/565, 544, 257/369, 555, 539, 582, 563, 605, 606, 653; 438/205, 313, 340, 203

(56) References Cited

U.S. PATENT DOCUMENTS 5,798,560 A * 8/1998 Ohkawa et al. ............. 257/555
6,049,118 A * 4/2000 Nagano ....................... 257/462
6,127,723 A * 10/2000 Aiello et al. ................ 257/582
6,365,447 B1 * 4/2002 Hebert et al. ............... 438/203

FOREIGN PATENT DOCUMENTS

JP   H 06-104459   4/1994   .................. 29/91

* cited by examiner

*Primary Examiner*—Sara Crane
*Assistant Examiner*—Junghwa M. Im
(74) *Attorney, Agent, or Firm*—Fish & Richardson P.C.

(57) ABSTRACT

In the semiconductor integrated circuit device, a first $P^+$ type buried layer formed as an anode region and an $N^+$ type diffused region formed in a cathode region are spaced from each other in the direction of the depth. This makes it possible to provide a semiconductor integrated circuit device in which a large depletion layer forming region can be provided in an N type region at a PN junction formed by first and second epitaxial layers and when a reverse bias voltage is applied to a diode element and in which a withstand voltage can be maintained by a depletion layer thus formed to prevent breakdown of elements in the device attributable to a breakdown current.

8 Claims, 10 Drawing Sheets

SEMICONDUCTOR INTEGRATED CIRCUIT DEVICE AND MANUFACTURING METHOD THEREOF

BACKGROUND OF THE INVENTION

The present invention relates to a semiconductor integrated circuit device incorporating a spark killer diode which is suitable for protecting an output transistor.

For example, as shown in FIG. 11, a three-phase motor driver employs a circuit configuration in which pairs of series-connected transistors (Tr1 and Tr2, Tr3 and Tr4, Tr5 and Tr6) are connected in parallel between a DC power source VCC and the ground GND and in which output terminals provided between the pairs of transistors Tr1 and Tr2, Tr3 and Tr4, and Tr5 and Tr6 are connected to a motor M.

In the case of an inductive load as described above, electromotive forces are generated in forward and reverse directions when the motor is rotated and stopped. In the conventional art, protective diodes are connected between the collectors and emitters of the integrated series-connected transistors, and the diodes 4 are turned on when the potential at the output terminals becomes lower than the ground potential or higher than the potential VCC because of the electromotive force in the reverse direction to lead the electromotive force to a fixed potential, thereby protecting the interior of the integrated circuit including the series-connected transistors. Especially, when a current as great as several amperes is applied to the diodes 4, the diodes 4 are configured as separate components.

There are demands from users for integration of the diodes 4 in order to reduce the number of components of an apparatus. However, when diodes to which a current as great as several amperes is applied are integrated, a parasitic current is caused by a parasitic transistor effect which inevitably occurs in the integrated circuit, and this can cause a wattless current and can lead to latch-up in the worst case.

For example, the structure disclosed in Japanese patent publication No. H06-104459 was proposed as a structure for preventing a parasitic current.

Referring to FIG. 12, an $N^+$ type buried layer 3 is provided between a P type semiconductor substrate 1 and an N type semiconductor substrate 2, and a $P^+$ type isolating region 4 is diffused from a surface of the semiconductor layer 2 to the semiconductor substrate 1 such that it encloses the buried layer 3 to form an island 5. A $P^+$ type buried layer 6 is formed on the buried layer 3 such that they partially overlap each other. An $N^+$ type lead region 7 is provided such that it encloses the $P^+$ type buried layer 6 and extends from a surface of the semiconductor layer 2 to the $N^+$ type buried layer 3, and an $N^+$ type diffused region 8 is formed in the enclosed region. Further, a $P^+$ type lead region 9 is provided in the region enclosed by the lead region 7 such that it encloses the diffused region 8 and extends from the semiconductor layer 2 to the $P^+$ type buried layer 6. Furthermore, a cathode 10 and an anode 11 are provided in the diffused region 8 and the $P^+$ type lead region 9 respectively, and the anode 11 is electrically connected to the $N^+$ type lead region 7.

That is, a diode is formed by the $P^+$ type lead region 9 and the $P^+$ type buried layer 6 serving as an anode region and the N type semiconductor region enclosed by the $N^+$ type diffused region 8 and lead region 9 serving as a cathode region.

In such a diode element, a PNP type parasitic transistor Tr2 is formed by the $N^+$ type buried layer 3 serving as the base, the $P^+$ type buried layer 6 serving as the emitter, aid the P type semiconductor substrate 1 and $P^+$ type isolating region 4 serving as the collector. Since the base and emitter of the parasitic transistor Tr2 is at the same potential through the connection of the anode, it is possible to prevent the parasitic PNP transistor from being turned on.

In the conventional semiconductor integrated circuit device described above, since electromotive forces in forward and reverse directions are generated when the motor is rotated and stopped in the case of an inductive load as shown in FIG. 11, protective diodes are connected between the collectors and emitters of the integrated series-connected transistors, and the diodes 4 are turned on when the potential at the output terminals becomes lower than the ground potential or higher than the potential VCC because of the electromotive force in the reverse direction to lead the electromotive force to a fixed potential, thereby protecting the interior of the integrated circuit including the series-connected transistors. Especially, when a current as great as several amperes is applied to the diodes 4, the diodes 4 are configured as separate components.

In order to satisfy demands for integration of the diodes 4 to achieve a reduction of the number of components of an apparatus, the diodes to which a current as great as several amperes is applied are integrated. In consideration to problems including a wattles current attributable to a parasitic current caused by a parasitic transistor effect which inevitably occurs in the integrated circuit, a structure as shown in FIG. 12 is employed in which diodes are incorporated in an IC.

Although the diodes 4 can be incorporated in an IC as described above, when the diodes 4 are off or when the cathodes 10 are at a voltage higher than the voltage at the anodes 11 in the structure shown in FIG. 12, it is necessary to provide a withstand voltage at which breakdown of the semiconductor device due to a breakdown current at the PN junction surface of the parasitic transistor TR1 can be avoided. Therefore, the width of the $P^+$ type buried layer 6 as the base region of the parasitic transistor TR1 is small in the conventional structure, which has resulted in a problem in that a sufficient withstand voltage can not be maintained for the parasitic transistor TR1 because it is difficult to suppress an increase in a current amplification factor hfe.

SUMMARY OF THE INVENTION

The present invention has been made taking the above-described problem with the conventional art into consideration, and a semiconductor integrated circuit device according to the invention comprises: a semiconductor substrate of a first conductivity type; a first epitaxial layer of an opposite conductivity type formed on a surface of the substrate; a first buried layer of the first conductivity type constituted by a high concentration impurity diffusion layer formed to overlap with a first buried layer of the opposite conductivity type constituted by a high concentration impurity diffusion layer formed between the substrate and the first epitaxial layer; a second epitaxial layer of the opposite conductivity type formed on a surface of the first epitaxial layer; a second buried layer of the first conductivity type and a second buried layer of the opposite conductivity type constituted by a high concentration impurity diffusion layer formed between the first epitaxial layer and the second epitaxial layer; a diffused region of the first conductivity type constituted by a high concentration impurity diffusion layer that is diffused from a surface of the second epitaxial layer to the second buried layer of the first conductivity type;

a first diffused region of the opposite conductivity type constituted by a high concentration impurity diffusion layer that is diffused from a surface of the second epitaxial layer to the second buried layer of the opposite conductivity type; a well region of the opposite conductivity type formed in the second epitaxial layer in a region surrounded by at least one of the diffused region of the first conductivity type and the second buried layer of the first conductivity type; and a second diffused region of the opposite conductivity type constituted by a high concentration impurity diffusion layer formed in an overlapping relationship with the well region, wherein the first buried layer of the first conductivity type and the second diffused region of the opposite conductivity type are separated in the direction of the depth.

In the semiconductor integrated circuit device according to the invention, preferably, the first buried layer of the first conductivity type and the first buried layer of the opposite conductivity type of the diode element are formed in an overlapping relationship, and the first buried layer of the first conductivity type and the diffused region of the first conductivity type are connected through the second buried layer of the first conductivity type. It has a structure in which the first buried layer of the first conductivity type and the second diffused region of the opposite conductivity type are spaced in the direction of the depth. This makes it possible to provide a semiconductor integrated circuit device in which a large depletion layer forming region can be provided in an N type region at a PN junction whose junction surface is formed by the first buried layer of the first conductivity type and the first epitaxial layer in the diode element when the diode element is off and in which a withstand voltage to cope with a reverse bias state can be maintained by the depletion layer to prevent breakdown of elements in the device attributable to a breakdown current.

Preferably, the well region of the opposite conductivity type is formed in an overlapping relationship with the cathode lead region of the opposite conductivity type of the diode element. This makes it possible to provide a semiconductor integrated circuit device in which a forward voltage VBEF can be reduced because of a reduction in the resistance of an N type region at a PN junction when the diode element is off to improve a forward current (If) capacity of the device significantly.

In order to solve the above-described problem, a method of manufacturing a semiconductor integrated circuit device according to the invention comprises the steps of: providing a semiconductor substrate of a first conductivity type; diffusing an impurity in the substrate to form a buried layer of an opposite conductivity type in each of regions where a diode element, a vertical transistor of the first conductivity type, and a vertical transistor of the opposite conductivity type are to be formed; diffusing an impurity in the substrate to form a first buried layer of the first conductivity type in the diode element forming region in an overlapping relationship with the buried layer of the opposite conductivity type; forming a first epitaxial layer of the opposite conductivity type on the substrate; diffusing an impurity on the first epitaxial layer to form a second buried layer of the first conductivity type in each of the regions to form a diode element and a vertical transistor of the first conductivity type; forming a second epitaxial layer of the opposite conductivity type on the first epitaxial layer; diffusing an impurity on the second epitaxial layer to form a diffused region of the first conductivity type in the diode element forming region, thereby connecting the diffused region of the first conductivity type to the first buried layer of the first conductivity type through the second buried layer of the first conductivity type; diffusing an impurity on the second epitaxial layer to form well regions of the opposite conductivity type in the regions to form a diode element and a vertical transistor of the first conductivity type simultaneously; and forming a second diffused region of the opposite conductivity type in the well region in the diode element forming region.

Preferably, the step of forming the second buried layer of the first conductivity type in the diode element forming region is provided for connecting the first buried layer of the first conductivity type with the diffused layer of the first conductivity type, the step making it possible to keep the first buried layer of the opposite conductivity type and the diffused region of the opposite conductivity type at a great interval in the direction of the depth, thereby increasing a depletion layer forming region.

DETAILED DESCRIPTION OF THE PREFERRED EMBODIMENT

An embodiment of the invention will now be described in detail with reference to the drawings.

Figure 1:
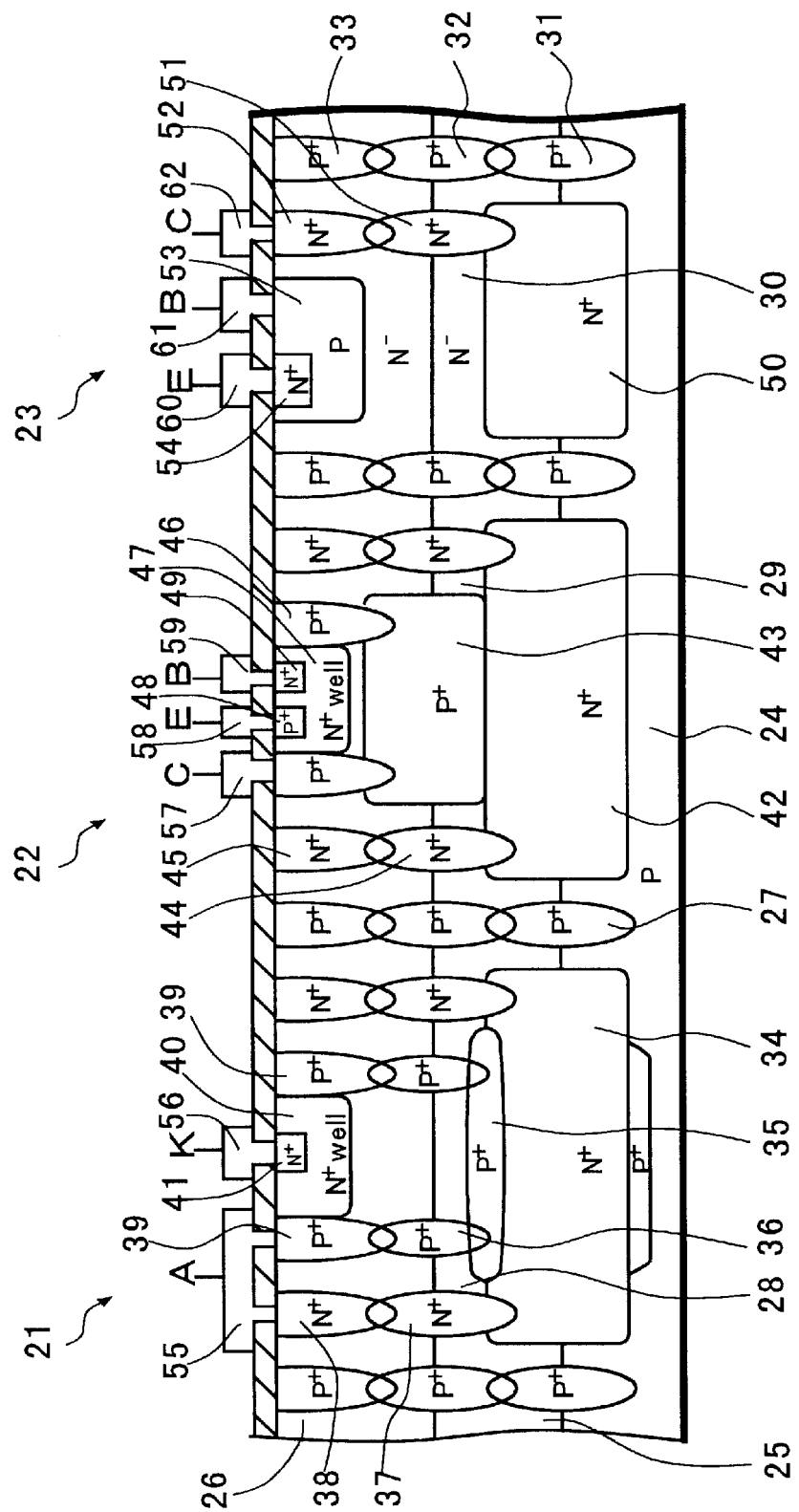
FIG. 1 is a sectional view illustrating a semiconductor integrated circuit device according to the invention.

FIG. 1 is a sectional view of a semiconductor integrated circuit device incorporating a diode element 21, a vertical PNP transistor 22, and an NPN transistor 23.

On a P type single crystal silicon substrate 24, a first epitaxial layer 25 having a thickness of 2 to 10 μm and a second epitaxial layer 26 having a thickness of 6 to 10 μm are formed such that the total thickness of the two layers becomes 8 to 16 μm. The substrate 24 and the first and second epitaxial layers 25 and 26 are electrically isolated by a P$^+$ type isolating region 27 which penetrates them to form a first island region 28 for forming the diode element 21, a second island region 29 for forming the vertical PNP transistor 22, and a third island region 30 for forming the NPN transistor 23.

The isolating region 27 includes a first isolating region 31 which is diffused in the vertical direction from a surface of the substrate 24, a second isolating region 32 which is diffused in the vertical direction from the boundary between the first and second epitaxial layers 25 and 26, and a third isolating region 33 which is formed from a surface of the second epitaxial layer 26, the three regions being connected with each other to isolate the first and second epitaxial layers 25 and 26 in the form of islands.

In the diode element 21 formed in the first island region 28, an N$^+$ type first buried layer 34 and a P$^+$ type first buried layer 35 are formed in an overlapping relationship between the substrate 24 and the first epitaxial layer 25; a P$^+$ type second buried layer 36 is formed at the boundary between the first and second epitaxial layers 25 and 26; and a P$^+$ type diffused region 39 which extends from a surface of the second epitaxial layer 26 to the P$^+$ type second buried layer 36 is formed as an anode lead region. The N$^-$ type first and second epitaxial layers 25 and 26 sandwiched by the P$^+$ type regions 36 and 39 are formed as a cathode region to configure a PN junction diode. An N$^+$ type diffused region 38 maybe formed in the second epitaxial layer 26 as an anode region, and the N$^+$ type diffused region 38 and the P$^+$ type diffused region 39 may be shorted to form an anode lead region. The resultant element may be regarded as a diode formed by shorting the base and collector of an NPN transistor.

In the semiconductor integrated circuit device according to the present embodiment as described above, the N$^+$ type first buried layer 34 and the P$^+$ type first buried layer 35 are formed between the substrate 24 and the first epitaxial layer 25 in an overlapping relationship. For example, the N$^+$ type first buried layer 34 is formed using antimony (Sb), and the P$^+$ type first buried layer 35 is formed using boron (B). This results in a structure in which the P$^+$ type first buried layers 35 are formed above and under the N$^+$ type first buried layer 34 as shown in FIG. 1 because of differences between the diffusing speeds and concentrations of the impurities. The P$^+$ type second buried layer 36 formed between the first epitaxial layer 25 and the second epitaxial layer 26 is connected with the P$^+$ type first buried layer 35 and the P$^+$ type diffused region 39. In this structure, a PN junction diode is formed, the P$^+$ type first buried layer 35 serving as the anode and the first and second epitaxial layers 25 and 26 serving as the cathode region.

While an N$^+$ type diffused region 41 is formed as a cathode lead region in the second epitaxial layer 26 formed as the cathode region, the N$^+$ type diffused region 41 and the P$^+$ type first buried layer 35 are spaced from each other in the direction of the depth of the structure as described above.

The above-described structure makes it possible to provide a semiconductor integrated circuit device in which a large depletion layer can be provided in an N type region formed by the first and second epitaxial layers 25 and 26 when the diode element 21 is off, i.e., when a reverse bias voltage is applied to a PN junction surface formed by the P$^+$ type first buried layer 35 and N$^-$ type first epitaxial layer 25 and in which a withstand voltage can be maintained by a depletion layer thus formed to prevent breakdown of elements in the device attributable to a breakdown current.

Further, in the semiconductor integrated circuit device of the present embodiment as described above, an N$^+$ type well region 40 is formed in the N$^-$ type second epitaxial layer 26 surrounded by the P$^+$ type regions 36 and 39 formed as a cathode region when the diode element is on. Since the resistance of the N type region at the PN junction decreases because of the presence of the N type well region 40 to reduce a forward voltage VBEF, it is possible to improve a forward current (If) capacity significantly.

The surface of the second epitaxial layer 26 is coated with a silicon oxide film, and various aluminum electrodes are provided through contact holes formed in the oxide film. A ground potential GND is applied to the substrate 24 for isolation of the junction.

Figure 2A:
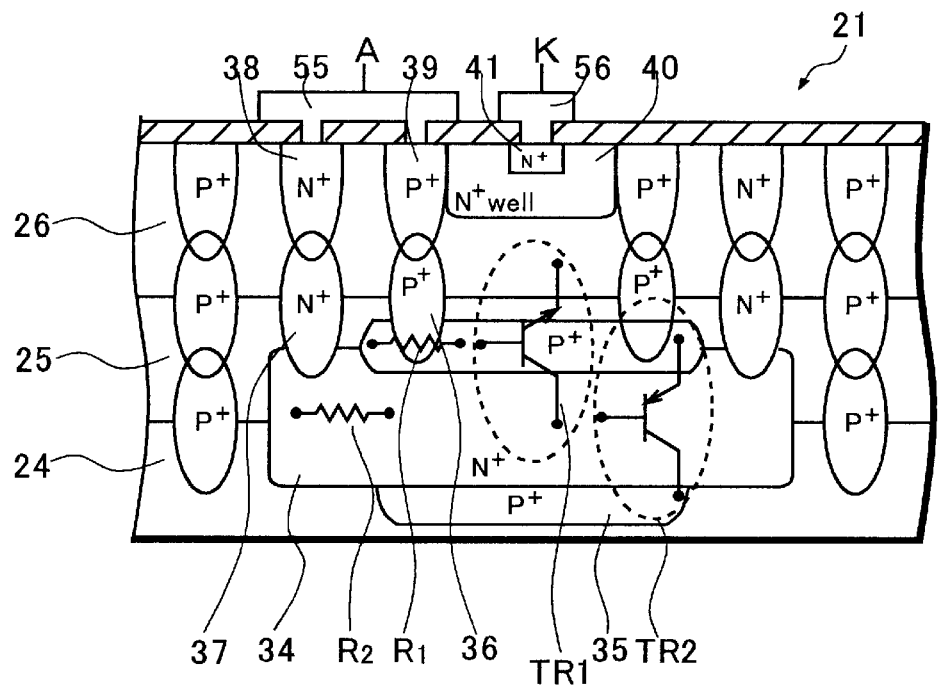
FIG. 2A is an enlarged sectional view illustrating diode elements in the semiconductor integrated circuit device in FIG. 1 according to the invention.
Figure 2B:
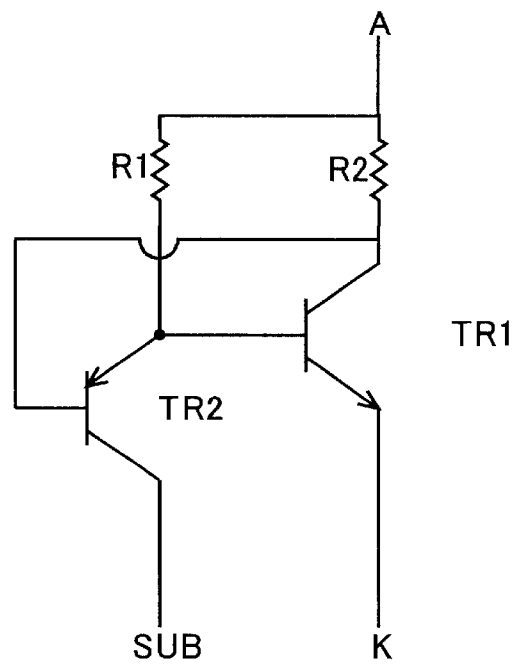
FIG. 2B is an equivalent circuit diagram of the same.

FIG. 2A is an enlarged cross section of the diode element 21, and FIG. 2B is an equivalent circuit diagram showing parasitic transistors. A description will now be made on operations of parasitic transistors that dominate a leakage current to the substrate 24 when the diode element 21 is on.

A parasitic NPN transistor TR1 is formed by the N$^+$ type first buried layer 34 serving as the collector, P$^+$ type first buried layer 35 serving as the base, and the first and second epitaxial layers 25 and 26 serving as the emitter. On the other hand, a parasitic PNP transistor TR2 is formed by the P type substrate 24 serving as the collector, the N$^+$ type first buried layer 34 serving as the base, and P$^+$ type first buried layer 35 serving as the emitter.

Referring to FIG. 2B, the base and collector of the parasitic NPN transistor TR1 are shorted by an anode 55, and the base and emitter of the parasitic PNP transistor TR2 are similarly shorted. At this time, a resistive component R1 originating from the P$^+$ type diffused region 39 and P$^+$ type buried layer 36 is connected between the base and collector of the parasitic PNP transistor TR1, and a resistive component R2 originating from the N$^+$ type diffused region 38, the N$^+$ type second buried layer 37, and the N$^+$ type first buried layer 34 is connected between the base and emitter of the parasitic PNP transistor TR2. In the structure of the diode element 21 according to the invention, the value of the resistive component R1 of the parasitic NPN transistor TR1 is quite small because of the configuration in which the P$^+$ type diffused region 39, P$^+$ type buried layer 36, and P$^+$ type first buried layer 35 are connected with each other. The value of the resistive component R2 of the parasitic PNP transistor TR2 is also quite small because the N$^+$ type diffused region 38, N$^+$ type second buried layer 37, and N$^+$ type first buried layer 34 are connected with each other.

According to the invention, since the resistance of the cathode region can be reduced as a result of the formation of the N$^+$ type well region 40, a forward current (If) capacity can be improved.

Since the value of the resistive component R2 connected between the base and emitter of the parasitic PNP transistor TR2 can be small, the base potential of the parasitic PNP transistor TR2 (the potential of the N$^+$ type first buried layer 34) can be maintained at a value higher than the emitter potential (the potential of the P$^+$ type buried layers 35 and 36). This makes it possible to prevent the parasitic PNP transistor TR2 from being turned on, thereby keeping a leakage current to the substrate 24 at a small value.

As a result, for example, while a leakage current of 100 mA flows to the substrate 24 when a current of 1 A flows through the conventional structure, the leakage current can be reduced to 20 mA in the inventive structure (when the resistance of the resistive component R2 is 8 Ω).

The vertical PNP transistor 22 formed in the second island region 29 basically has a structure similar to that of the diode element 21. Specifically, a P+ type buried layer 43 is formed as a collector region at the boundary between the first and second epitaxial layers 25 and 26, and a P+ type diffused region 46 extending from a surface of the second epitaxial layer 26 to the P+ type buried layer 43 is formed as a collector lead region. The vertical PNP transistor 22 is formed by forming an N+ type well region 47 as a base region in the N− type second epitaxial layer 26 enclosed by those P+ type regions and by forming a P+ type diffused region 48 and an N+ type diffused region 49 as an emitter region and a base lead region respectively in the N+ type well region 47. Further, an N+ type diffused region 45 is formed such that it encloses the P+ type diffused region 46 and is connected with the first buried layer 42 through an N+ type second buried layer 44 to apply a power supply voltage Vcc from an electrode which is not shown or the potential of an emitter electrode 58. The purpose is to prevent the generation of a parasitic PNP transistor formed by the P+ type diffused region 46 serving as the emitter, the second island region 29 serving as the base, and the P+ type isolating region 27 as the collector. Thus, the vertical PNP transistor can be a PNP transistor that is preferably used for great currents.

The NPN transistor 23 formed in the third island region 30 is configured by forming the third island region 30 as a collector region, the P type diffused region 53 as a base region, and the N+ type diffused region 54 as an emitter region. A first N+ type buried layer 50 is formed between the substrate 24 and the first epitaxial layer 25, and a second N+ type buried layer 51 is formed at the boundary between the first and second epitaxial layers 25 and 26, those layers being connected with each other. Further, an N+ type diffused region 52 is provided as a collector lead region, and the N+ type diffused region 52 is also formed in connection with the second N+ type buried layer 51. By forming regions with a high concentration and low resistance under a collector electrode 62 as described above, the saturation resistance Vce (sat) of the NPN transistor 23 is reduced. Thus, the NPN transistor 23 has a high with stand voltage and accommodates a great current, and it is therefore suitable for use in circuits such as motor drivers.

A method of manufacturing a semiconductor integrated circuit device according to the invention as shown in FIG. 1 will now be described with reference to FIGS. 3 through 10.

Figure 3:
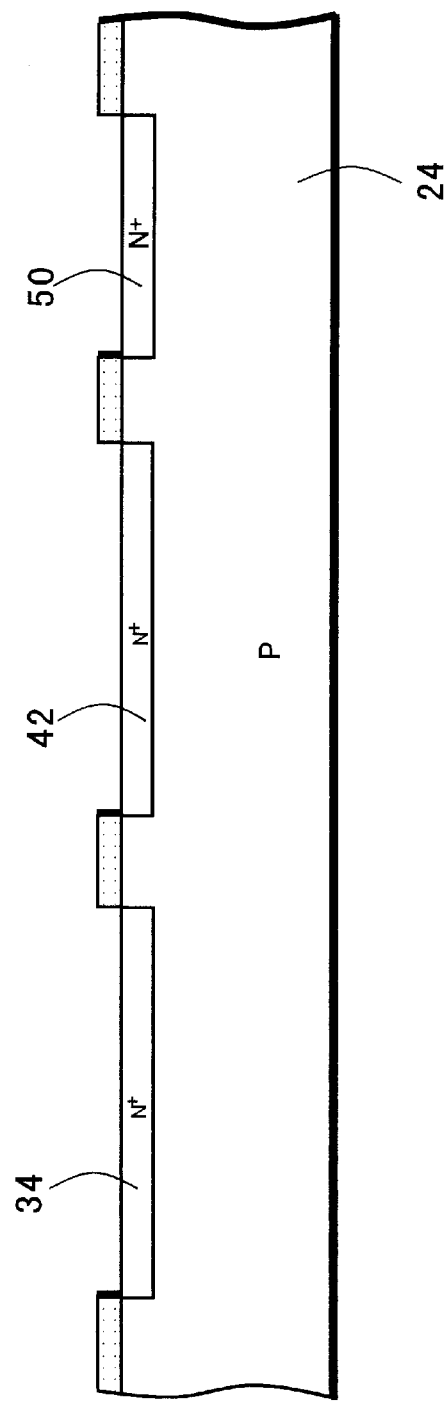
FIG. 3 is a sectional view illustrating a method of manufacturing a semiconductor integrated circuit device according to the invention.

First, as shown in FIG. 3, the P− type single crystal silicon substrate 24 is provided; the surface of the substrate 24 is thermally oxidized to form an oxide film, and photo-etching is performed in regions of the oxide film corresponding to the N+ type buried layers 34, 42, and 50 to provide a selective mask. Then, antimony (Sb) is diffused on the surface of the substrate 24 to form the N+ type buried layers 34, 42, and 50.

Figure 4:
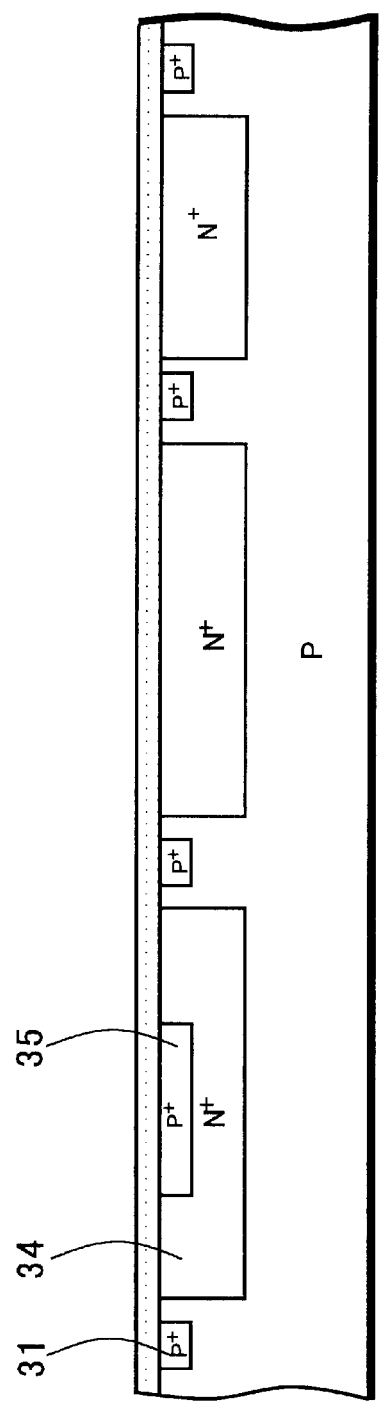
FIG. 4 is a sectional view illustrating the method of manufacturing a semiconductor integrated circuit device according to the invention.

Next, as shown in FIG. 4, ion implantation is carried out to form the P+ type buried layer 35 and the first isolating region 31 of the P+ type isolating region 27. After removing the oxide film used as a selective mask in FIG. 3 completely, a well-known photolithographic technique is used to form a photo-resist (not shown) as a selective mask having an opening in a part thereof where the P+ type first isolating region 31 is to be formed. Then, ions of a P type impurity, e.g., boron (B) are implanted with an acceleration voltage of 160 keV and in a dose of $1.0 \times 10^{14}/cm^2$. The photo-resist is thereafter removed.

Figure 5:
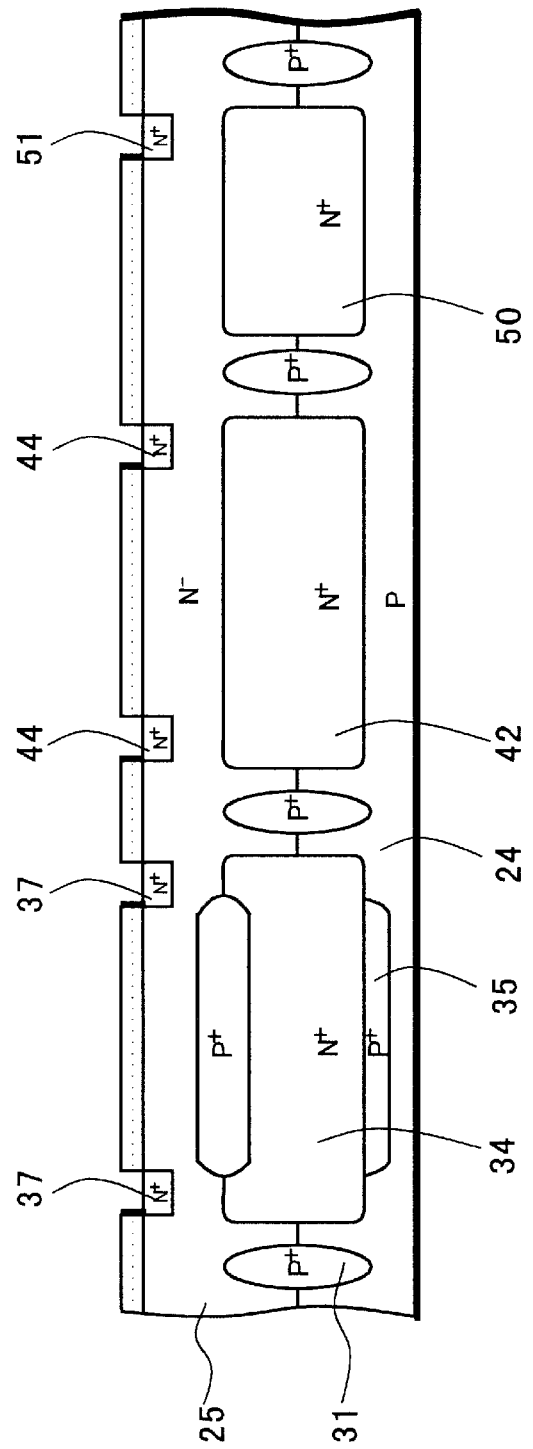
FIG. 5 is a sectional view illustrating the method of manufacturing a semiconductor integrated circuit device according to the invention.

Next, as shown in FIG. 5, the substrate 24 is placed on a susceptor of an epitaxial growth apparatus after removing the oxide film completely; the substrate 24 is heated by a lamp at a high temperature of about 1140° C.; and $SiH_2Cl_2$ gas and $H_2$ gas are introduced into the reaction tube. As a result, the first epitaxial layer 25 is grown with a thickness of 2.0 to 10.0 μm on a low concentration epitaxial basis (ρ=1.25 Ω·cm). The surface of the first epitaxial layer 25 is then thermally oxidized to form an oxide film, and photo-etching is thereafter performed in regions of the oxide film corresponding to the N+ type second buried layers 37, 44, and 51 to provide a selective mask.

At the same time, the N+ type buried layers 34, 42, and 50 and the P+ type buried layers 31 and 35 are diffused on the surface of the substrate 24. At this time, since boron (B) that is used to form the P+ type buried layer 35 has a higher diffusing speed and a lower impurity concentration compared to antimony (Sb) that is used to form the N+ type buried layer 34, the P+ type buried layer is formed above and under the N+ type buried layer 34.

Figure 6:
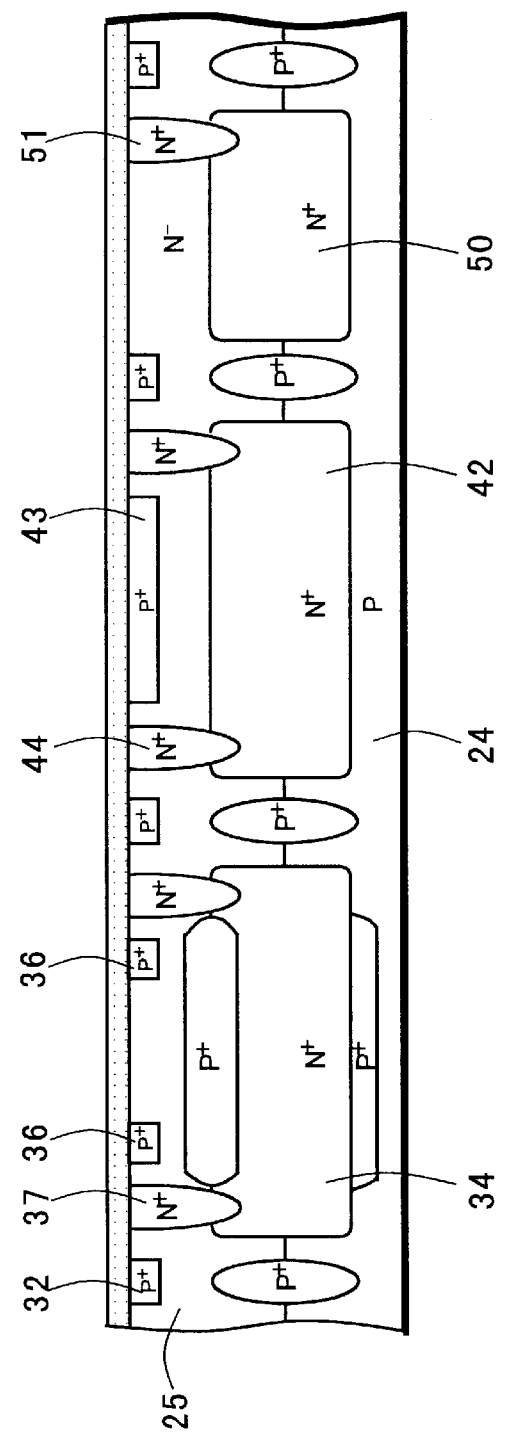
FIG. 6 is a sectional view illustrating the method of manufacturing a semiconductor integrated circuit device according to the invention.

Next, as shown in FIG. 6, the surface of the first epitaxial layer 25 is thermally oxidized again after removing the oxide film completely, and a well-known photolithographic technique is used to form a photo-resist (not shown) as a selective mask having openings in parts thereof where the P+ type buried layers 36 and 43 and the P+ type second isolating region 32 are to be formed. Then, ions of a P type impurity, e.g., boron (B) are implanted with an acceleration voltage of 40 keV and in a dose of $3.0 \times 10^{13}/cm^2$. The photo-resist is there after removed. At this time, the second N+ type buried layers 37, 44, and 51 are simultaneously diffused and are connected with the first N+ type buried layers 34, 42, and 50.

Figure 7:
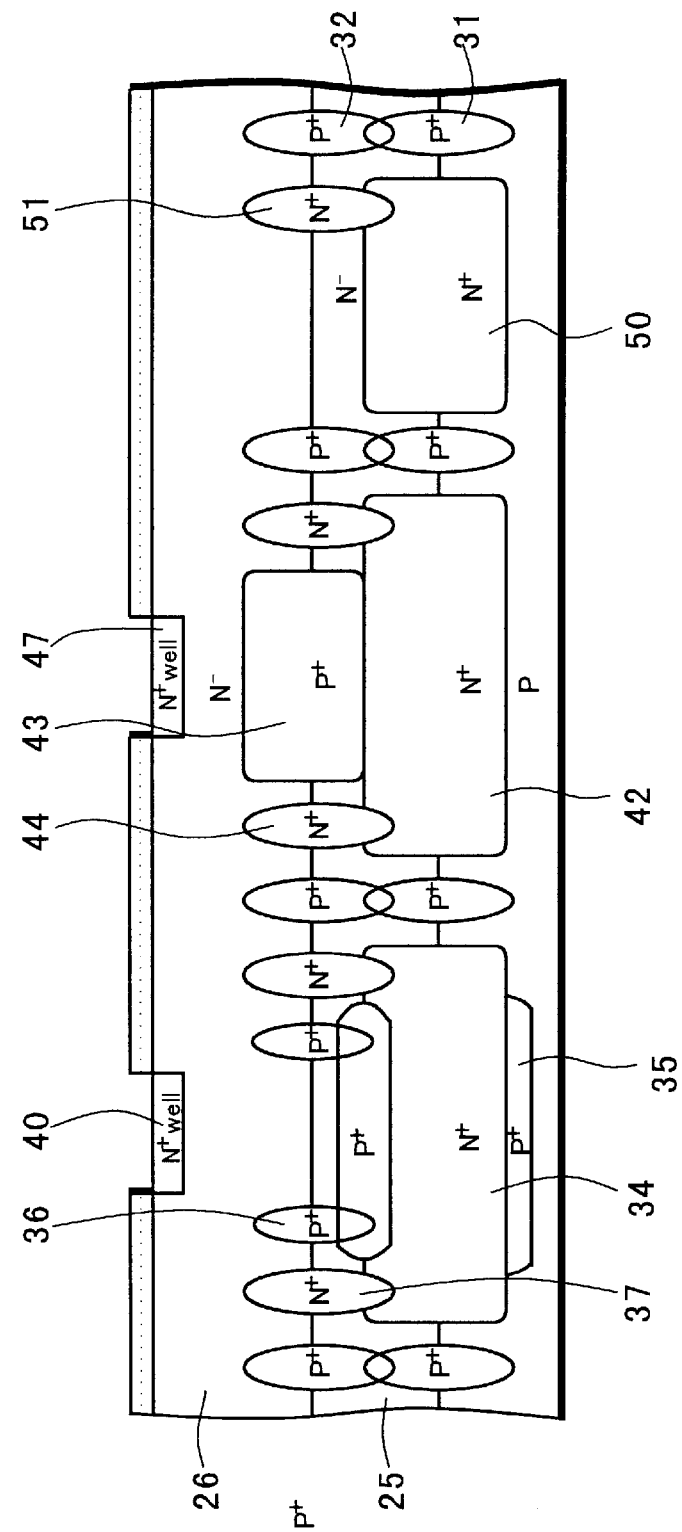
FIG. 7 is a sectional view illustrating the method of manufacturing a semiconductor integrated circuit device according to the invention.

Next, as shown in FIG. 7, the substrate 24 is placed on the susceptor of the epitaxial growth apparatus after removing the oxide film completely; the substrate 24 is heated by the lamp at a high temperature of about 1140° C.; and $SiH_2Cl_2$ gas and $H_2$ gas are introduced into the reaction tube. As a result, the second epitaxial layer 26 is grown on the first epitaxial layer 25 with a thickness of 6.0 to 10.0 μm on a low concentration epitaxial basis (ρ=1.25 Ω·cm). The surface of the second epitaxial layer 26 is then thermally oxidized to form an oxide film, and a well-known photolithographic technique is there after used to form a photo-resist (not shown) as a selective mask having openings in parts thereof where the N+ type well regions 40 and 47 are to be formed. Then, ions of an N type impurity, e.g., phosphorous (P) are implanted with an acceleration voltage of 160 keV and in a dose of $1.0 \times 10^{12}/cm^2$. The photo-resist is thereafter removed.

At this time, the P+ type buried layers 36 and 43 and the P+ type second isolating region 32 are simultaneously diffused and are connected with the first P+ type buried layers 35, first N+ type buried layer 42, and P+ type first isolating region 31, respectively.

Figure 8:
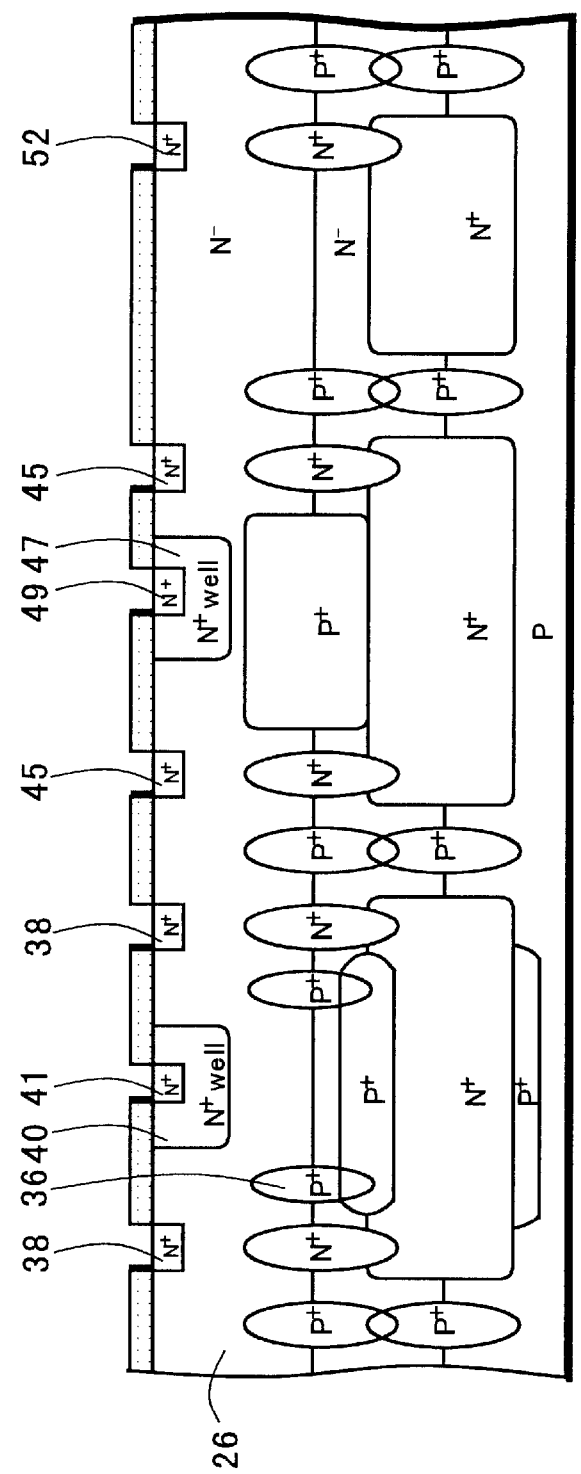
FIG. 8 is a sectional view illustrating the method of manufacturing a semiconductor integrated circuit device according to the invention.

Next, as shown in FIG. 8, the surface of the second epitaxial layer 26 is thermally oxidized to form an oxide film, and photo-etching is performed in regions of the oxide film corresponding to the N+ type collector lead regions 38, 45, and 52 and the base lead region 49 to provide a selective mask. Then, antimony (Sb) is diffused on the surface of the second epitaxial layer 26 to form the N+ type diffused regions 38, 45, and 52 and the base lead region 49.

Figure 9:
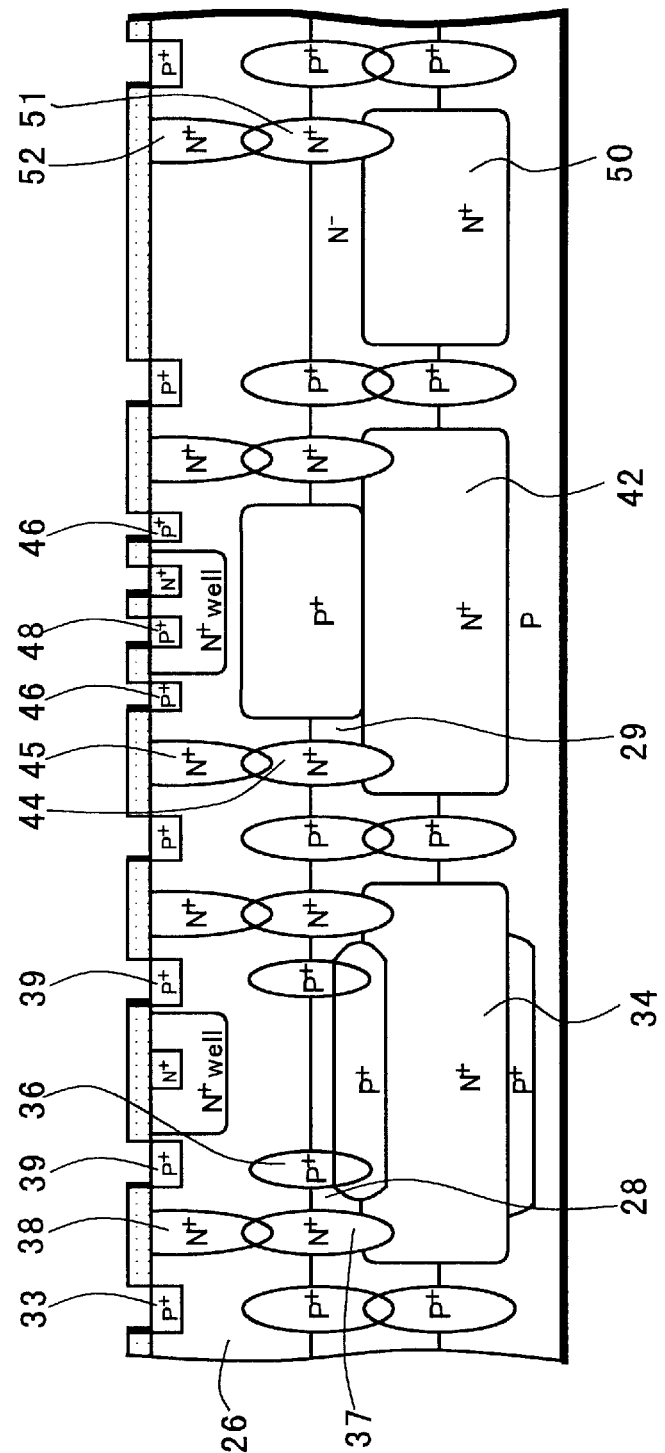
FIG. 9 is a sectional view illustrating the method of manufacturing a semiconductor integrated circuit device according to the invention.

Next, as shown in FIG. 9, the surface of the second epitaxial layer 26 is thermally oxidized again after removing the oxide film completely, and a well-known photolithographic technique is used to form a photo-resist (not shown) as a selective mask having openings in parts thereof where the P+ type diffused regions 39 and 46, the P+ type emitter region 48, and the P+ type third isolating region 33 are to be formed. Then, ions of a P type impurity, e.g., boron (B) are implanted with an acceleration voltage of 40 keV and in a dose of $3.0 \times 10^{13}/cm^2$. The photo-resist is thereafter removed.

At this time, the second N⁺ type buried layers 37, 44, and 51 are simultaneously diffused and are connected with the first N⁺ type buried layers 34, 42, and 50. The N⁺ type diffused regions 38, 45, and 52 are also diffused simultaneously and are connected with the second N⁺ type buried layers 37, 44, and 51, respectively. As a result, the diode element 21 is completed in the first island region 26, and the vertical PNP transistor 22 is completed in the second island region 29.

Figure 10:
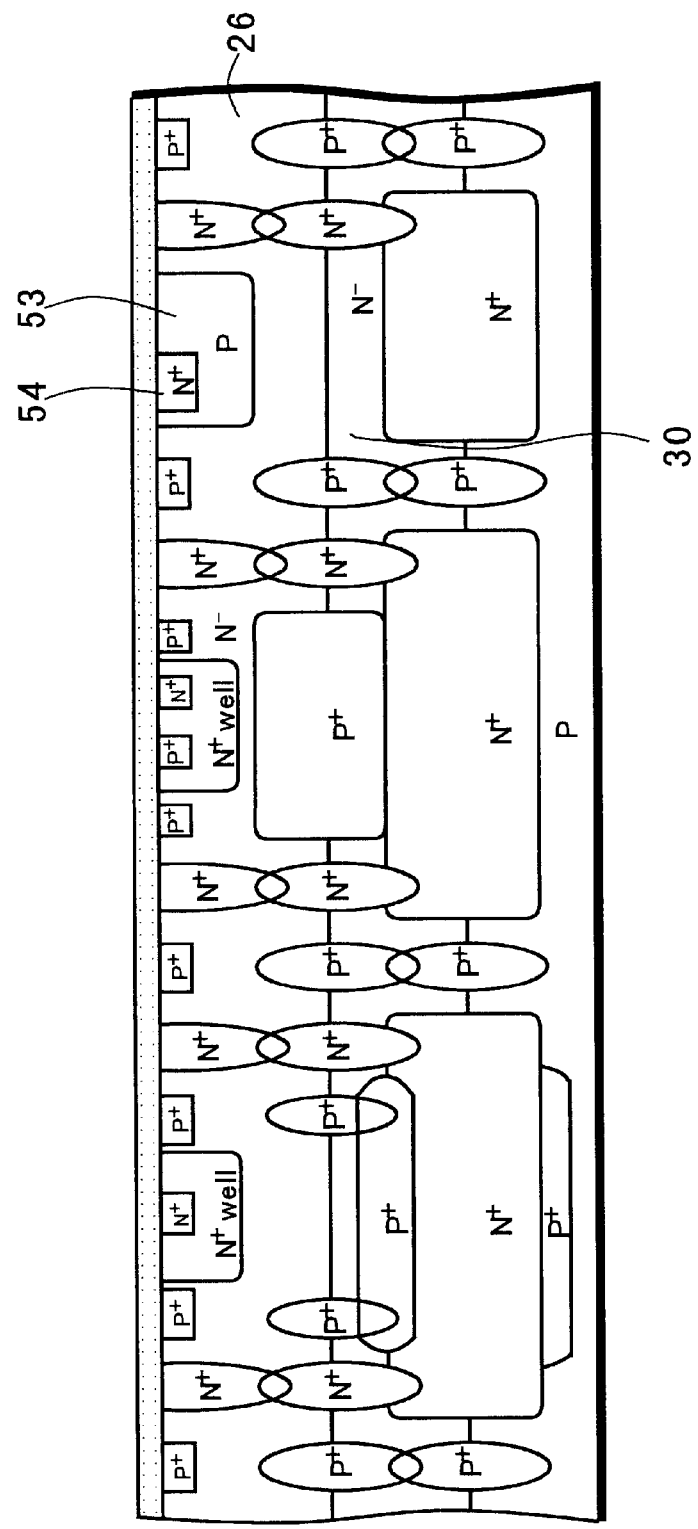
FIG. 10 is a sectional view illustrating the method of manufacturing a semiconductor integrated circuit device according to the invention.
Figure 11:
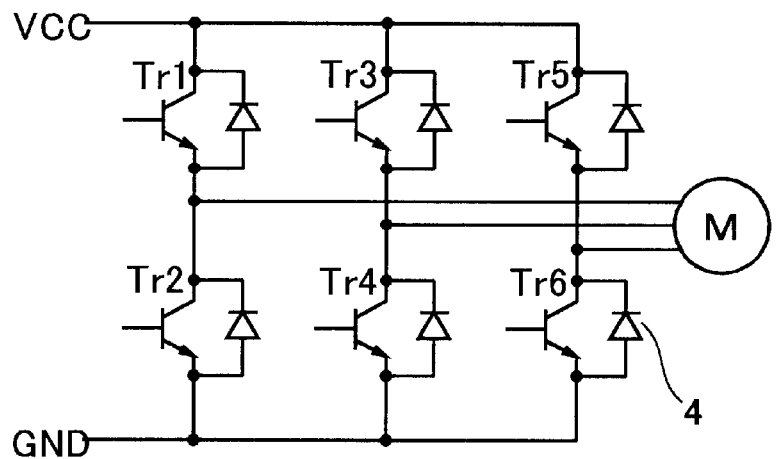
FIG. 11 is a circuit diagram illustrating a conventional semiconductor integrated circuit device.
Figure 12:
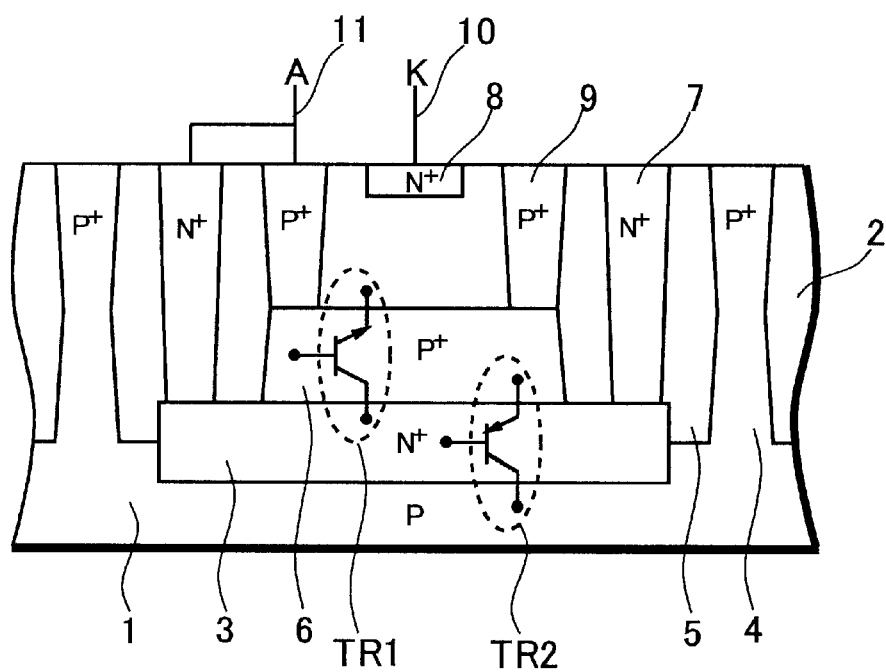
FIG. 12 is a sectional view illustrating diode elements in the conventional semiconductor integrated circuit device.

Next, as shown in FIG. 10, the NPN transistor 23 is completed by forming the P type base region 53 and the N⁺ type emitter region 54 in the third island region 30. Thereafter, as shown in FIG. 1, an anode 55 and a cathode 56 are formed at the diode element 21; a collector electrode 57, an emitter electrode 58, and abase electrode 59 are formed at the vertical PNP transistor 22; and an emitter electrode 60, a base electrode 61, and a collector electrode 62 are formed at the NPN transistor 23 from aluminum, which connects those elements to external electrodes.

According to the invention, in the diode element of the semiconductor integrated circuit device, the P⁺ type first buried layer formed between the substrate and the first epitaxial layer and the N⁺ type diffused region connected to the cathode form a PN junction, and they are spaced from each other in the direction of the depth. This makes it possible to provide a semiconductor integrated circuit device in which a large depletion layer forming region can be provided in an N type region formed by the first and second epitaxial layers when the diode element is off or when a reverse bias voltage is applied to the diode element and in which breakdown of elements in the device attributable to a breakdown current can be avoided by maintaining a withstand voltage by the depletion layer thus formed.

According to the invention, in the diode element of the semiconductor integrated circuit device, an N⁺ type well region is formed in an N type second epitaxial layer that is formed as a cathode region when the diode element is on. Since the N⁺ type well region reduces the resistance of the N type region of the PN junction to reduce a forward voltage VBEF, forward current (If) capacity can be significantly improved.

Further, by forming the N⁺ type well region according to the invention, the current amplification factor of the parasitic transistor TR1 formed in the diode element is improved; the current amplification factor of the parasitic transistor TR2 can be reduced; and the effect of suppressing a leakage current to the substrate is improved. This makes it possible to integrate spark killer diodes suitable for protection of output transistors with a semiconductor integrated circuit device, and this contributes to reduction of the size of electronic apparatuses and improvement of the density of the same.

What is claimed is:

1. A semiconductor integrated circuit device comprising:
   a semiconductor substrate of a first conductivity type;
   a first epitaxial layer of an opposite conductivity type formed on a surface of the substrate;
   a first buried layer of the first conductivity type constituted by a high concentration impurity diffusion layer formed to overlap with a first buried layer of the opposite conductivity type constituted by a high concentration impurity diffusion layer formed between the substrate and the first epitaxial layer;
   a second epitaxial layer of the opposite conductivity type formed on a surface of the first epitaxial layer;
   a second buried layer of the first conductivity type and a second buried layer of the opposite conductivity type constituted by a high concentration impurity diffusion layer formed between the first epitaxial layer and the second epitaxial layer;
   a diffused region of the first conductivity type constituted by a high concentration impurity diffusion layer that is diffused from a surface of the second epitaxial layer to the second buried layer of the first conductivity type;
   a first diffused region of the opposite conductivity type constituted by a high concentration impurity diffusion layer that is diffused from a surface of the second epitaxial layer to the second buried layer of the opposite conductivity type;
   a well region of the opposite conductivity type formed in the second epitaxial layer in a region surrounded by at least one of the diffused region of the first conductivity type and the second buried layer of the first conductivity type; and
   a second diffused region of the opposite conductivity type constituted by a high concentration impurity diffusion layer formed in an overlapping relationship with the well region,
   wherein the first buried layer of the first conductivity type and the second diffused region of the opposite conductivity type are separated in the direction of the depth.

2. The semiconductor integrated circuit device according to claim 1, wherein the first buried layer of the first conductivity type and the first diffused region of the first conductivity type are connected through the second buried layer of the first conductivity type.

3. The semiconductor integrated circuit device according to claim 1, wherein the first diffused region of the opposite conductivity type and the first diffused region of the first conductivity type are formed as an anode lead region, and in that the second diffused region of the opposite conductivity type is formed as a cathode lead region.

4. The semiconductor integrated circuit device according to claim 1, further comprising an anode and a cathode both formed on the second epitaxial layer,
   wherein the first diffused layer of the first conductivity type and the first diffused layer of the opposite conductivity type are connected to the anode,
   wherein the second diffused layer of the opposite conductivity type is connected to the cathode.

5. The semiconductor integrated circuit device according to claim 1, further comprising:
   a vertical transistor of the first conductivity type including a second well region of the opposite conductivity type,
   wherein the well region of the opposite conductivity type and the second well region of the opposite conductivity type are diffused regions which are formed at the same diffusing step.

6. A semiconductor integrated circuit device comprising:
   a substrate of a first conductivity type;
   a first epitaxial layer of a second conductivity type disposed above the substrate;
   a first buried domain of the second conductivity type comprising a high impurity diffusion domain disposed between the substrate and the first epitaxial layer;
   a second buried domain of the first conductivity type comprising a high impurity diffusion domain disposed to overlap with the first buried domain;

a second epitaxial layer of a second conductivity type disposed above the first epitaxial layer;

a third buried domain of the first conductivity type and a fourth buried domain of the second conductivity type each comprising a high impurity diffusion domain disposed between the first epitaxial layer and the second epitaxial layer;

a first diffusion region of the first conductivity type comprising a high impurity diffusion layer that is diffused from a surface of the second epitaxial layer to the third buried domain; and a second diffusion region of the second conductivity type comprising a high impurity diffusion domain that is diffused from a surface of the second epitaxial layer to the fourth buried domain.

7. The semiconductor integrated circuit device according to claim 6, further comprising:

a well region of the second conductivity type disposed in the second epitaxial layer in a region surrounded by at least the first diffusion region or the third buried domain; and a third diffusion region of the second conductivity type comprising a high impurity diffusion domain disposed in an overlapping relationship with the well region, wherein the second buried domain and the third diffusion region are separated in the direction of the depth.

8. The semiconductor integrated circuit device according to claim 6, wherein the first conductivity type is P-type and the second conductivity type is N-type.

* * * * *